(12) United States Patent
Swartz

(10) Patent No.: US 6,589,350 B1
(45) Date of Patent: Jul. 8, 2003

(54) VACUUM PROCESSING CHAMBER WITH CONTROLLED GAS SUPPLY VALVE

(75) Inventor: Dennis C. Swartz, Buda, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 263 days.

(21) Appl. No.: 09/658,044

(22) Filed: Sep. 8, 2000

(51) Int. Cl.$^7$ .......................... C23C 16/00; H05H 1/00; F11D 3/00
(52) U.S. Cl. ................. 118/710; 118/715; 118/692; 156/345.26; 156/345.33; 137/624.11; 137/906
(58) Field of Search .................. 118/710, 715, 118/684, 685, 692, 680, 681, 695, 696, 697, 698, 708, 711, 712; 156/345.26, 345.33; 137/624.12, 624.13, 624.14, 624.15, 624.16, 624.17, 624.11, 906

(56) References Cited

U.S. PATENT DOCUMENTS

| | | | |
|---|---|---|---|
| 3,772,670 A | * 11/1973 | Swithenbank et al. ........ 431/15 |
| 3,794,292 A | * 2/1974 | Jaegtnes ...................... 251/31 |
| 4,169,439 A | * 10/1979 | Tsiang et al. ................ 123/699 |
| 4,220,173 A | * 9/1980 | O'Brien ....................... 137/239 |
| 4,399,836 A | * 8/1983 | Versterre et al. .......... 137/487.5 |
| 4,423,484 A | * 12/1983 | Hamilton ..................... 700/284 |
| 4,754,690 A | * 7/1988 | Louis et al. .................... 91/51 |
| 4,809,742 A | * 3/1989 | Grau ........................... 137/554 |
| 4,941,501 A | * 7/1990 | Bireley ....................... 137/78.3 |
| 5,463,986 A | * 11/1995 | Hollis ......................... 123/41.1 |
| 6,279,594 B1 | * 8/2001 | Beitzel et al. .................. 137/1 |

OTHER PUBLICATIONS

Stanley Wolf and Richard N. Tauber; *Silicon Processing for the VLSI Era, vol. 1—Process Technology*; pp. 84–85; 1986, No month.

* cited by examiner

Primary Examiner—Gregory Mills
Assistant Examiner—P. Hassanzadeh
(74) Attorney, Agent, or Firm—Timothy M. Honeycutt

(57) ABSTRACT

An apparatus for and a method of introducing a gas into a vacuum processing chamber are provided. In one aspect, a processing apparatus is provided that includes a vacuum processing chamber, a first source of gas coupled to the vacuum processing chamber, and a fluid actuated valve for regulating the flow of the gas from the first source of gas to the vacuum processing chamber. The fluid actuated valve is operable to open in response to a flow of an actuating fluid and has a minimum valve opening pressure. A valve is provided for enabling the actuating fluid to flow to the fluid actuated valve. A controller is provided for selectively modulating the flow of the actuating fluid to the fluid actuated valve whereby the pressure of the actuating fluid is increased incrementally from an initial pressure to at least the minimum valve opening pressure. The apparatus reduces the risk of troublesome gas bursts in vacuum processing chambers.

25 Claims, 4 Drawing Sheets

VACUUM PROCESSING CHAMBER WITH CONTROLLED GAS SUPPLY VALVE

BACKGROUND OF THE INVENTION

1. Field of the Invention

This invention relates generally to semiconductor processing, and more particularly to an apparatus and method for delivering gas to a vacuum processing chamber.

2. Description of the Related Art

Vacuum chambers are used in a myriad of applications in semiconductor processing. Chemical vapor deposition, physical vapor deposition, etching, rapid thermal processing and scanning electron microscopy represent just a few of the types of applications that require reduced pressure environments. Although the specific components in vacuum processing systems vary widely depending upon the particular application, most such systems incorporate a vacuum chamber and one or more gas supply lines that are used to deliver various types of gases to the vacuum chamber. Depending upon the application, the gases may be etchants, chemical vapor deposition reaction products, inert flushing gases, oxidizing ambients or other types of gases. The processing gases may be delivered from discrete cylinders, or via more complex delivery systems depending upon the gaseous species.

The flow of gases into the vacuum processing chamber is controllled by a valve. In many cases, a flow restrictor, such as a mass flow controller, and a pressure relief valve are used in conjunction with the gas supply valve. Gas supply valves are manufactured in a variety of different arrangements, such as needle valves, disk valves and flap valves to name just a few. Regardless of the particular configuration, the, opening of the gas supply valve involves the unseating of a member, e.g., a diaphragm seat, from a fully closed position to an open position to enable the gas flow through an orifice and into the vacuum chamber. Most gas supply valves are biased to a fully closed position by a spring, bellows arrangement, or other type of biasing member. The opening of the valve involves application of a force to overcome the spring bias to unseat the valve member.

In many types of gas supply valves, the spring bias is overcome by manually or otherwise turning a handle on a valve stem or otherwise applying an axial force to the valve stem. One example of these is a solenoid actuated valve. Other types of gas supply valves are fluid actuated. In these types of designs, the unseating of the valve member is accomplished by supplying a pressurized fluid via a pilot line to a portion of the valve to overcome the closing force of the valve's biasing member. A pilot line supply valve is opened to deliver pilot pressure to and open the fluid actuated gas supply valve. Fluid actuated valves are favored in applications involving potentially explosive processing gases and/or where positive and complete shut-off is required for process isolation.

The pressure differentials between the gas supply line and the vacuum processing chamber can be quite large and produce a phenomenon known as pressure burst. The initial opening of the gas supply valve results in an instantaneous burst of gas into the vacuum processing chamber. This burst of gas into the chamber can dislodge particulates from the walls of the vacuum chamber and from the sides and bottom of the semiconductor wafer. These liberated particulates can settle on the critical circuit structures of the wafer as contaminates and lead to yield problems. Pressure burst may also lead to process variations across the surface of the wafer due to the irregular movement of gases through the vacuum chamber.

The problem of pressure burst stems largely from the fact that the opening of the gas supply valve constitutes a gross mechanical movement in many conventional vacuum processing systems. For example, in conventional vacuum processing chamber systems employing fluid actuated gas supply valves, the opening of the gas supply valve entails the rapid delivery of full pilot line pressure to the gas supply valve. This near instantaneous delivery of full pilot pressure to the fluid actuated supply valve is necessary to ensure that the fluid actuated supply valve unseats and moves to an open position. Most operators deliver a pilot line pressure that is well in excess of the factory specified minimum opening pressure for the fluid actuated gas supply valve. This is due to the fact that pilot actuated supply valves may exhibit a higher minimum opening pressure than factory specified as a result of manufacturing variations or unanticipated wear. To provide the requisite pilot line pressure, the pilot line supply valve is rapidly moved to a fully open position. Little attempt is made to modulate the flow of pilot line fluid to the fluid actuated gas supply valve. As a result, any residual pressure behind the fluid actuated gas supply valve can rapidly dump into the vacuum processing chamber.

The present invention is directed to overcoming or reducing the effects of one or more of the foregoing disadvantages.

SUMMARY OF THE INVENTION

In accordance with one aspect of the present invention, a processing apparatus is provided that includes a vacuum processing chamber, a first source of gas coupled to the vacuum processing chamber, and a fluid actuated valve for regulating the flow of the gas from the first source of gas to the vacuum processing chamber. The fluid actuated valve is operable to open in response to a flow of an actuating fluid and has a minimum valve opening pressure. Means are provided for selectively modulating the flow of the actuating fluid to the fluid actuated valve whereby the pressure of the actuating fluid is increased incrementally from an initial pressure to at least the minimum valve opening pressure.

In accordance with another aspect of the present invention, a processing apparatus is provided that includes a vacuum processing chamber, a first source of gas coupled to the vacuum processing chamber, and a fluid actuated valve for regulating the flow of the gas if from the first source of gas to the vacuum processing chamber. The fluid actuated valve is operable to open in response to a flow of an actuating fluid and has a minimum valve opening pressure. A valve is provided for enabling the actuating fluid to flow to the fluid actuated valve. A controller is provided for selectively modulating the flow of the actuating fluid to the fluid actuated valve whereby the pressure of the actuating fluid is increased incrementally from an initial pressure to at least the minimum valve opening pressure.

In accordance with another aspect of the present invention, a method is provided of introducing a gas into a chamber via a fluid actuated supply valve that has a minimum opening pressure and is in fluid communication with a supply of actuating fluid. An initial gas pressure in the chamber is sensed. A flow of actuating fluid to the fluid actuated supply valve is cycled on and off X cycles to gradually increase the pressure of the actuating fluid to at least the minimum opening pressure. The gas pressure in the chamber is sensed again and the fluid actuated supply valve is opened if the gas pressure in the chamber is greater than the initial gas pressure.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
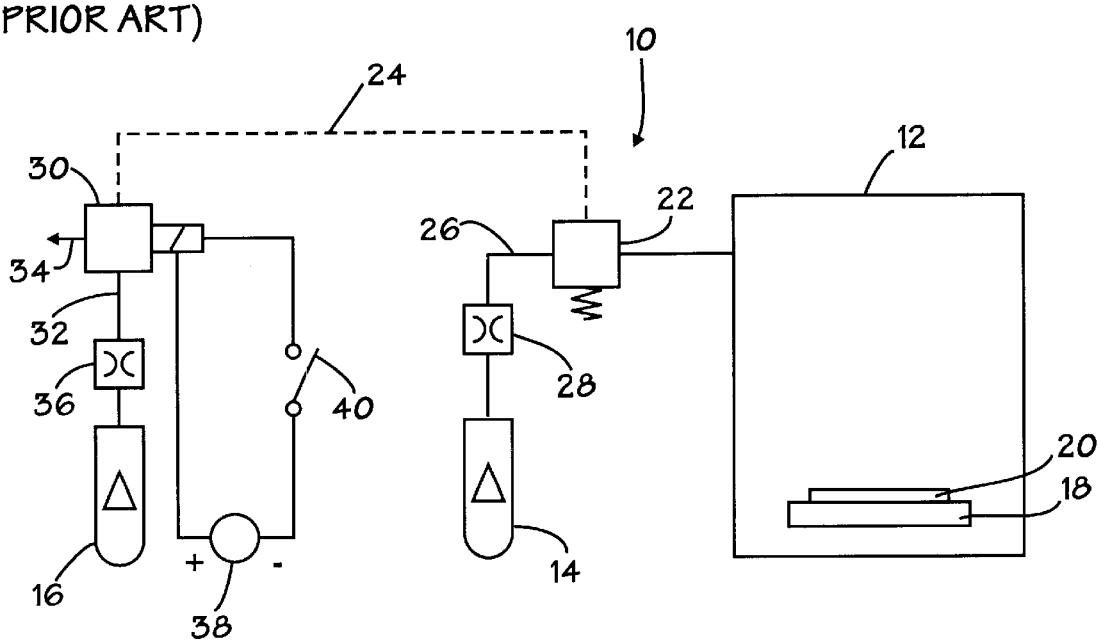
FIG. 1 is a schematic view of conventional vacuum system for processing semiconductor wafers.

In the drawings described below, reference numerals are generally repeated where identical elements appear in more than one figure. FIG. 1 is a schematic view of an exemplary conventional vacuum processing system 10 that includes a vacuum processing chamber 12, a supply 14 of a working gas, and a supply 16 of an actuating fluid. The processing chamber 12 is provided with a stage or holder 18 for holding a workpiece or wafer 20. The flow of working gas from the gas supply 14 into the processing chamber 12 is regulated by a spring biased bellows valve 22 that is pilot actuated by means of a fluid pilot line 24. The gas from the gas supply 14 is delivered to the processing chamber 12 by a supply line 26. A mass flow controller 28 is coupled to the supply line 26 between the gas supply 14 and the supply valve 22. The purpose of the mass flow controller 28 is to restrict the gas flow rate into the processing chamber to some preselected desired value. Actuating fluid in the pilot line 24 to open and shut the supply valve 22 is provided by the fluid reservoir 16. The flow of actuating fluid from the reservoir 16 is controlled by a solenoid actuated valve 30 that is a multi-port valve, with a port to the pilot line 24, a port to a supply line 32 coupled to the gas supply 16 and a port 34 to atmosphere. A pressure regulator 36 is coupled to the supply line 32 between the solenoid valve 30 and the gas supply 16. The pressure regulator 36 is configured to limit the pressure of fluid delivered from the gas supply 16 to a preselected maximum value. The solenoid actuated valve 30 is energized by a power supply 38. The flow of power to the solenoid valve 30 is controlled by a simple on/off switch 40.

The supply valve 22 is manufactured with a factory rated minimum opening pressure, that is, the minimum pilot line pressure which will result in the opening of the valve 22. However, in practice, the supply valve 22, when installed, may have a minimum opening pressure that varies significantly from the factory rated pressure level.

The mass flow controller 28 is a flow restriction device that is not fully closed at any point in time. As a consequence, even though the supply valve 22 may be closed, there will be some residual gas pressure accumulating in the supply line 26 between the mass flow controller 28 and the input of the supply valve 22.

The operation of the vacuum system 10 will be described. Initially, the switch 40 is open as shown and the solenoid actuated valve 30 is de-energized. When the switch 40 is closed, the solenoid actuated valve 30 is energized and opened, releasing a volume of gas from the gas supply 16 into the pilot line 24. Upon energizing, the solenoid actuated valve 30 is fully opened and held in a fully open position so long as the power supply 38 is connected directly thereto. The opening of the solenoid actuated valve 30 to its fully open position will normally occur in under a second, depending upon the make and model of the valve 30. The make and configuration of the pressure regulator 36 and the gas supply 16 are such that the pressure of actuating fluid delivered to the supply line 32 will be more than sufficient to exceed the minimum opening pressure for the supply valve 22 taking into account any head losses associated with flow through the pilot line 24 and the supply line 32 as well as the regulator 36 and the valve 30.

To ensure that the supply valve does fully open in response to the pilot line pressure, the pressure of the fluid in the pilot line 24 is normally delivered at a much higher level than necessary for the minimum opening pressure of the supply valve 22. As a consequence, when the valve 30 is opened, a burst of pressure is transmitted through the pilot line 24 and rapidly opens the supply valve 22. The aforementioned residual pressure within the supply line 26 due to the aforementioned flow-through condition of the mass flow controller 28 results in an instantaneous burst of gas into the processing chamber 12. This burst of gas into the processing chamber 12 can lead to at least two unwanted effects on the processing of the workpiece 20. First, the rapid burst of gas into the chamber 12 can dislodge various particulates on the sidewalls of the chamber 12 and more importantly, on the sides and outer edges of the workpiece 20. These liberated particulates may then fall on the central portions of the upper surface of the workpiece and contaminate the sensitive circuit structures being fabricated thereon. Second, the rapid burst of gas pressure into the processing chamber may lead to process variations across the surface of the workpiece 20. This, for example, may give rise to variations in film thicknesses, etch rates and other parameters associated with the workpiece that may lead to yield difficulties.

The problem of pressure bursts from the supply valve 22 stems from the way in which the conventional system 10 controls the delivery of actuating fluid through the pilot line 24. As noted above, the solenoid actuated valve 30 is energized, fully opened, and maintained in a fully opened position. Little attempt is made to match the pressure of the actuating fluid in the pilot line 24 to the minimum opening pressure of the supply valve.

Figure 2:
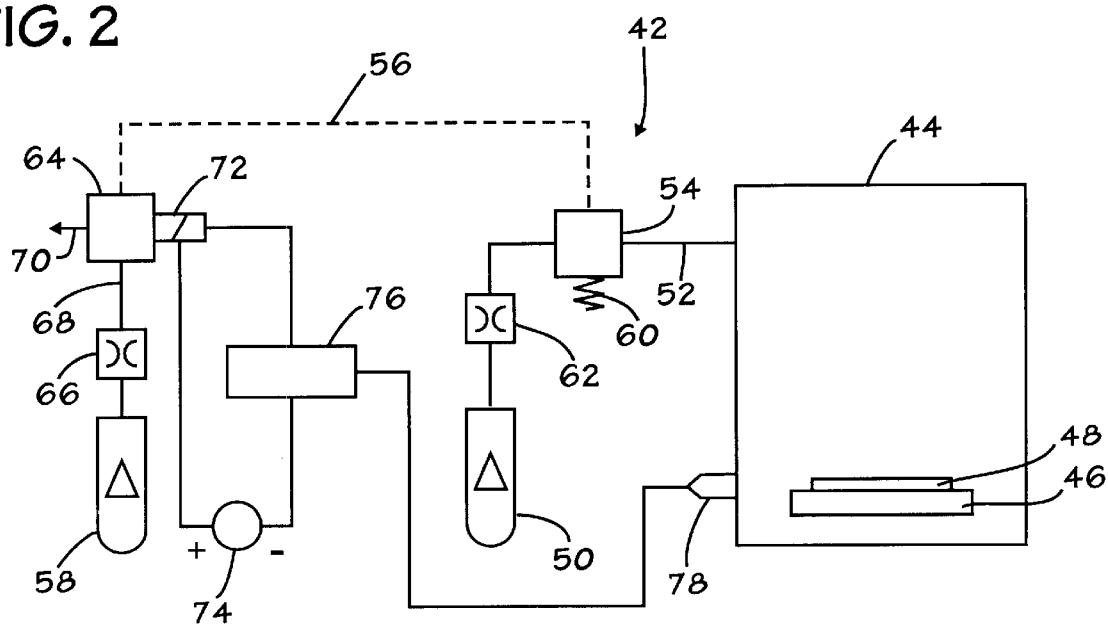
FIG. 2 is a schematic view of an exemplary embodiment of a vacuum processing apparatus in accordance with the present invention.

FIG. 2 depicts a schematic view of an exemplary embodiment of a workpiece or wafer processing apparatus 42 ("processing apparatus") in accordance with the present invention. The apparatus 42 includes a vacuum processing chamber 44 that is provided with a stage or holder 46 to hold a workpiece 48. The processing chamber 44 may be any of several different types of processing chambers used in semiconductor processing, such as, for example, chemical vapor deposition chambers, physical vapor deposition chambers, etching chambers and thermal processing chambers, to name just a few. A processing gas source 50 is provided for supplying a volume of processing gas into the processing chamber 44 by way of a supply line 52. The processing gas may be any of a variety of gases used in semiconductor processing applications, such as etching, chemical vapor deposition, thermal processing to name just a few.

A fluid actuated supply valve 54 is coupled to the supply line 52 as a means of enabling and disabling the flow of the gas through the supply line 52. The supply valve 54 is advantageously fluid actuated, that is, opened by application of fluid pressure through a pilot line 56 that is coupled to a fluid source 58. The supply valve 54 is normally biased closed by the biasing element 60, which may be a spring or other type of biasing member. The supply valve 54 is opened by application of fluid pressure through the pilot line 56 at a sufficient magnitude to overcome the biasing force of the biasing member 60. A mass flow controller 62 is coupled to the supply line 52 between the gas supply 50 and the supply valve 54 and serves as a flow restrictor to limit the maximum flow rate of gas into the processing chamber 44. The term "vacuum" in conjunction with the processing chamber 44 simply denotes that the pressure in the chamber 44 will initially be lower than the pressure in the supply line 52 prior to the opening of the valve 54.

Like the mass flow controller 28 depicted in FIG. 1 in the conventional apparatus 10, the mass flow controller 62 is not normally capable of completely shutting off gas flow therethrough. Accordingly, when the supply valve 54 is closed, some residual gas pressure will leak through the mass flow controller 62 and build-up in the supply line 52 behind the supply valve 54.

The flow of actuating fluid from the fluid supply 58 to the pilot line 56 is controlled by an electrically actuated supply valve 64 and by a pressure regulator 66 that is coupled to a supply line 68 between the supply valve 64 and the fluid supply 58. The fluid supply 58 may be pneumatic or hydraulic as desired. In an exemplary embodiment, the fluid supply 58 is a source of pressurized gas, such as air or nitrogen. The pressure regulator 66 is a flow restriction device designed to limit the maximum pressure delivered to the pilot line 56 to some preselected maximum level. The valve 64 is a multi-port valve with a port 70 to atmosphere, a port to the pilot line 56 and an input port to the supply line 68. The valve 64 is electrically actuated by a solenoid 72 or a like electrical actuating device. Power to energize the solenoid 72 is provided by a power supply 74, which may be AC or DC as desired.

Unlike the conventional embodiment disclosed above, the actuation of the supply valve 64 is modulated by a controller 76. The controller 76 is operable to cycle the supply valve on and off a preselected number of cycles so that the fluid pressure in the pilot line 56 may be gradually increased up to and slightly above the minimum opening pressure for the fluid actuated supply valve 54. In this way, the fluid actuated supply valve 54 may be urged to unseat in a relatively slow manner so that any fluid pressure built up in the supply line 52 at the input side of the supply valve 54 may be gradually released into the processing chamber 44, and thus the deleterious effects of pressure bursts into the processing chamber may be avoided.

Figure 3:
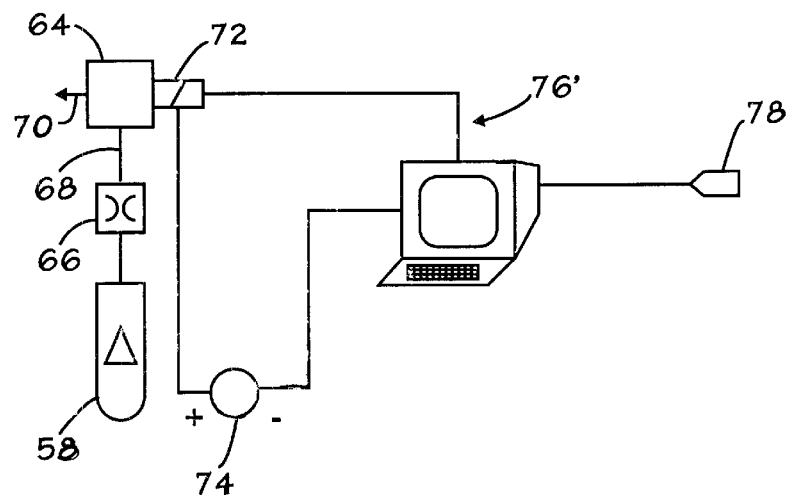
FIG. 3 is a schematic view of an alternate exemplary embodiment of the vacuum processing apparatus in accordance with the present invention.
Figure 4:
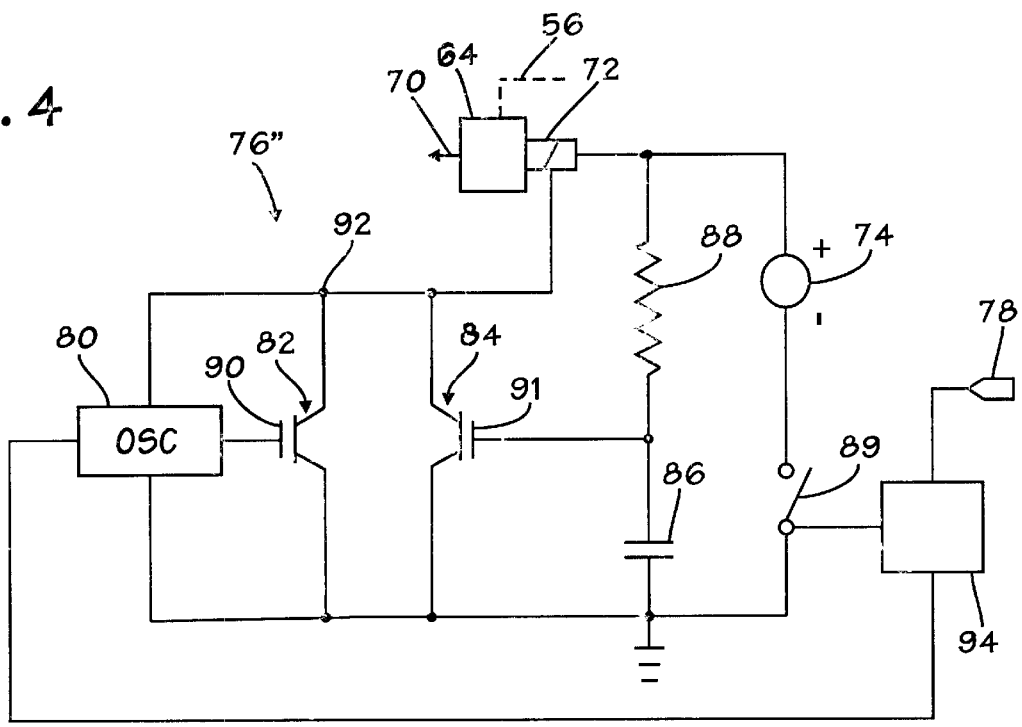
FIG. 4 is a schematic view of another alternate exemplary embodiment of the vacuum processing apparatus in accordance with the present invention.

The functionality of the controller 76 may be implemented in a great variety of ways. FIGS. 3 and 4 represent just two such possible alternative implementations. Turning initially to FIG. 3, therein is shown an embodiment of the controller now designated 76', that is implemented as a computer or other programmable logic device. The controller 76' may be programmed to cycle the flow of power on and off to the solenoid 72 a preselected number of cycles over a preselected time interval to provide for the aforementioned gradual upward ramping of pressure in the pilot line 56 shown in FIG. 2. The controller 76' is also operable to read a pressure signal generated by a pressure sensor 78 that is coupled to the processing chamber 44. In this way, the controller 76' is operable to sense the pressure in the chamber 44, particularly in response to the controlled opening of the fluid actuated supply valve 54. The programmable computer 76' is operable to not only cycle the supply valve 64 on and off through a preselected schedule but also to acquire and interpret pressure signals from the pressure sensor 78.

FIG. 4 depicts an alternate embodiment of the controller now designated 76''. The controller 76'' includes an oscillator 80 and transistors 82 and 84 coupled in parallel with the power supply 74 and a capacitor 86 and a series connected resistor 88. A switch 89 is provided to open and close the circuit to the solenoid 72 of the supply valve 64. The output of the oscillator 80 is tied to a gate 90 of the transistor 82. The gate 91 of the transistor 84 is tied to the capacitor 86. The solenoid 72 is tied to a node 92. An integrated circuit 94 is provided for controlling the action of the oscillator 80, for data acquisition and interpretation of signals provided by the pressure sensor 78, and may be used to actuate the switch 89 as shown. The integrated circuit 94 may be a microprocessor, an embedded controller, or other type of integrated circuit. The oscillator 80 and the transistor 82 provide the initial cycling of power to the solenoid 72, while the transistor 84, the series connected resistor 88 and the capacitor 86 provide for a delay-on functionality for the power to the solenoid 72.

Figure 5:
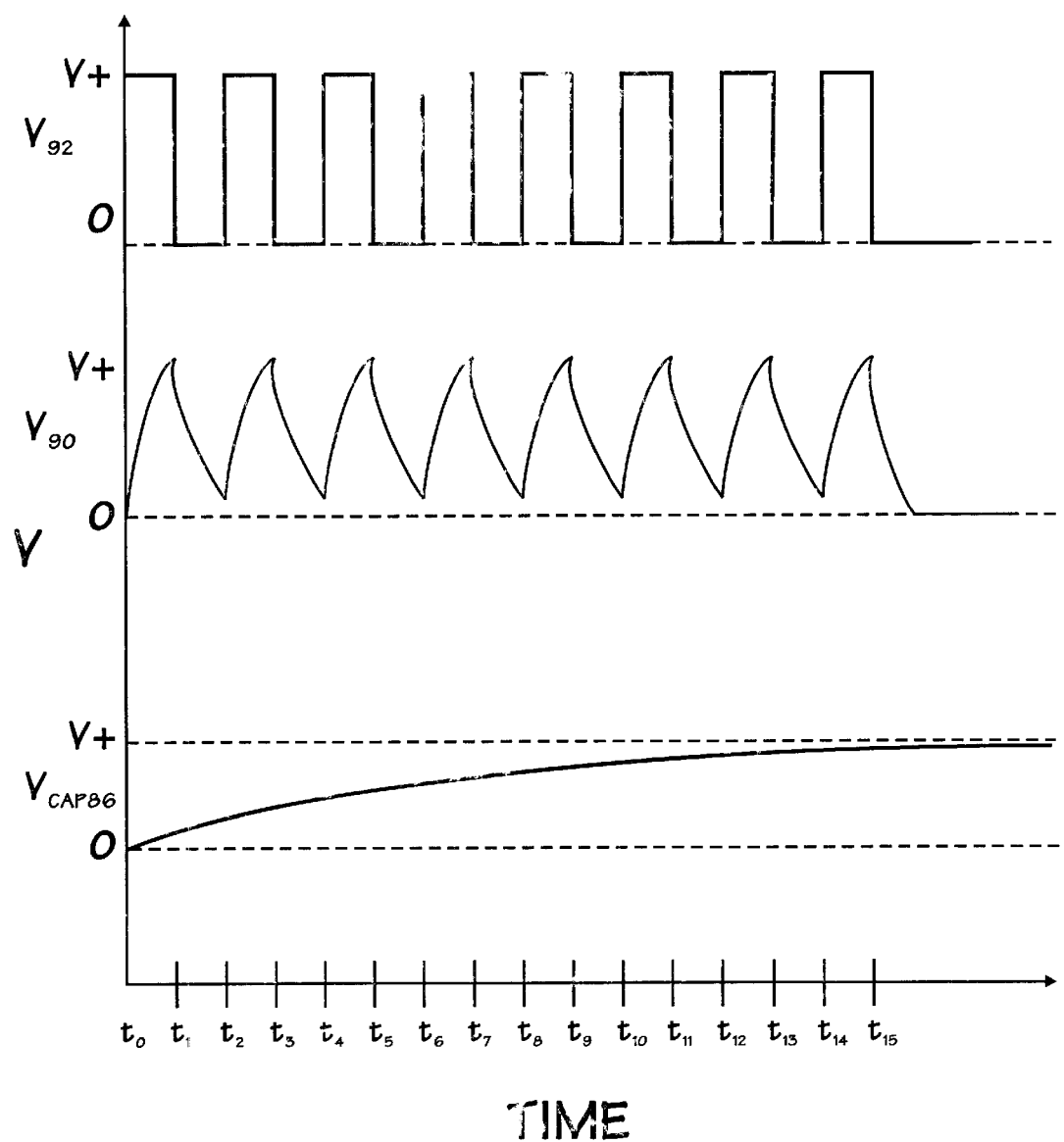
FIG. 5 is a timing diagram depicting the timing of some of the components of the vacuum processing apparatus depicted in FIG. 4.

The operation of the controller 76'' may be understood by referring now also to the timing diagram of FIG. 5. In FIG. 5, the plot of the voltage at node 92 is labeled $V_{92}$, the plot of oscillator 80 output is labeled $V_{90}$ and the plot of capacitor 86 voltage is labeled $V_{CAP86}$. At a time $t_0$, the switch 89 is closed, power from the power supply 74 is on and the capacitor 86 begins charging. The gate 91 of the transistor 84 is low and the transistor 84 is off. Initial power to the oscillator 80 is supplied via leakage current through the solenoid 72. At this point, the output of the oscillator 80 and the gate 90 are low, and the transistor 82 is off until the oscillator output voltage $V_{90}$ climbs high enough to turn transistor 82 on at time $t_1$. The solenoid 72 is activated and the supply valve 64 partially opens. At a time $t_2$, the oscillator output $V_{90}$ swings low enough to shut off the transistor 82, cutting off power to the solenoid 72 and enabling the supply valve 64 to begin closing. At a time $t_2$, the oscillator 80 again swings high and cycles on the solenoid 72 and opens the supply valve 64. The oscillator 80 is cycled on and off in this manner a preselected number of times while the capacitor 86 is charging. In this way, the valve 64 is opened and closed a number of times to allow fluid pressure to incrementally build in the pilot line 56. When the capacitor 86 reaches a fully charged condition at time $t_{15}$, the gate 91 swings high enough such that the transistor 84 is now on and the oscillator 80 is effectively by-passed. The solenoid 72 is activated and the supply valve 64 is held open for as long as the switch 89 is closed. The switch 89 will be typically held open after time $t_{15}$ for some duration appropriate for the quantity of gas needed in the chamber 44 shown in FIG. 2.

The delay-on time interval $t_0 \ldots t_{15}$ is determined by the RC constant of the resistor 88 and the capacitor 86, and by the threshold voltage of the transistor 84, and thus is largely a matter of design discretion. The length of the on-time cycles, that is, the intervals $t_1 \ldots t_2, t_3 \ldots t_4 \ldots t_{13} \ldots t_{14}$, is largely a matter of design discretion. Indeed, the intervals $t_1 \ldots t_2, t_3 \ldots t_4 \ldots t_{13} \ldots t_{14}$ need not be equal. However, the length of the on-time cycles $t_1 \ldots t_2, t_3 \ldots t_4 \ldots t_{13} \ldots t_4$ should be long enough to ensure that the valve 64 at least unseats. Depending on the specific make and model of the valve 64, the length of on-time cycles $t_1 \ldots t_2, t_3 \ldots t_4 \ldots t_{13} \ldots t_{14}$ may be shorter than, greater than or equal to the mechanical response time of the supply valve 64. For example, if the valve 64 requires about 0.25 seconds to move from a fully closed position to a fully open position, then the on-time cycle appropriately may be shorter than about 0.25 seconds. The length of the off-time intervals, that is, $t_2 \ldots t_3, t_4 \ldots t_5 \ldots t_{14} \ldots t_{15}$, etc., should be selected to be shorter than the mechanical response time of the supply valve 64. Note that the number of on-off cycles performed during the delay-on time interval $t_0 \ldots t_{15}$ is largely a matter of design discretion.

The oscillator 80 may be implemented using a myriad of different circuits. Exemplary circuits, include for example, relaxation oscillators, programmable unijunction transistor-based oscillators, operational amplifier based oscillators and integrated circuit based oscillators to name just a few. In like fashion, the transistors 82 and 84 may be field effect devices or bipolar devices.

Figure 6:
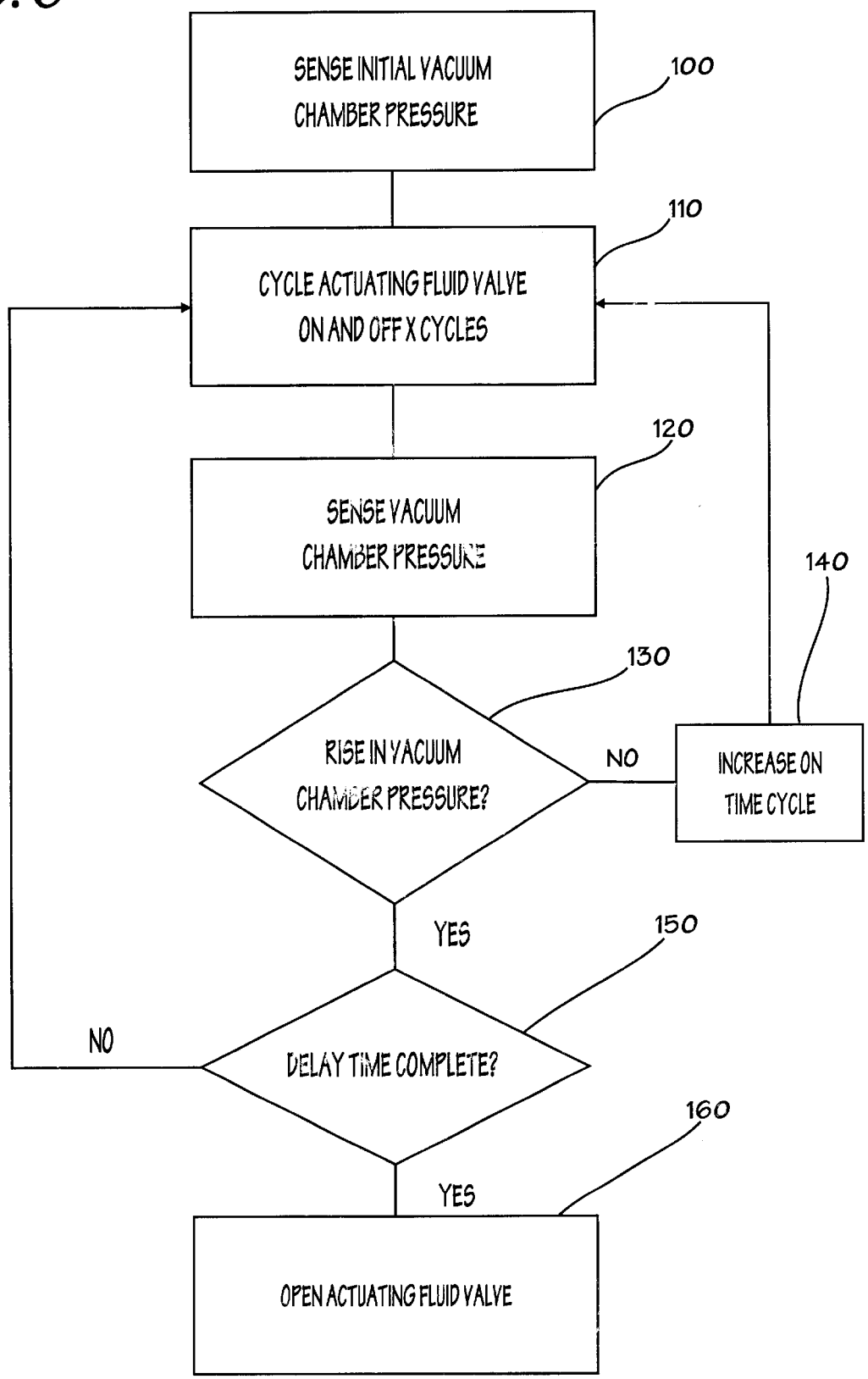
FIG. 6 is a flow chart illustrating an exemplary control scheme for the various embodiments of the vacuum processing apparatus in accordance with the present invention.

A flow chart depicted in FIG. 6 illustrates the control scheme for the opening of the supply valve 64 and thus the supply valve 54 shown in FIG. 2. In step 100, the initial pressure in the vacuum chamber 44 is sensed by the pressure sensor 78. The signal from the sensor 78 is interpreted by the controller 76. In step 110, the supply valve 64 is cycled on and off through X number of cycles by the controller 76. At step 120, the pressure in the vacuum chamber 44 is sensed. At step 130, the newly measured chamber pressure is compared to the initial chamber pressure. If there is no rise in chamber pressure, additional cycling of the valve 64 is warranted with an attendant increase in the on-time cycle, e.g., $t_0 \ldots t_1$. Steps 110 through 140 are then repeated as provided in step 140. However, if a rise in chamber pressure is detected, then the elapsed time is compared to the preselected delay-on interval as provided in step 150. If the delay-on interval has not elapsed, then steps 110 through 150 are repeated. If the delay-on interval has elapsed, then the supply valve 64 is held open and thus the supply valve 54 is held open as provided in step 160.

The skilled artisan will appreciate that the apparatus and method of the present invention provide for the controlled opening of a gas supply valve for a vacuum processing chamber. Pilot line pressure to fluid actuated supply valves is gradually ramped up to produce a controlled and gradual increase in gas pressure inside the vacuum chamber. The risks associated with pressure bursts in the vacuum chamber may be reduced.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A processing apparatus, comprising:
   a vacuum processing chamber;
   a first source of gas coupled to the vacuum processing chamber;
   a fluid actuated valve for regulating the flow of the gas from the first source of gas to the vacuum processing chamber, the fluid actuated valve being operable to open in response to a flow of an actuating fluid and having a minimum valve opening pressure; and
   means configured to selectively modulate the flow of the actuating fluid to the fluid actuated valve whereby the pressure of the actuating fluid is increased incrementally from an initial pressure to at least the minimum valve opening pressure.

2. The processing apparatus of claim 1, wherein the means for selectively modulating the flow of the actuating fluid comprises a valve for controlling the flow of the actuating fluid and a controller for selectively controlling the actuation of the valve, the controller being operable to rapidly cycle the valve open and shut during a time interval to enable the pressure of the actuating fluid acting on the fluid actuated valve to be increased incrementally.

3. The processing apparatus of claim 2, wherein the controller comprises a computer.

4. The processing apparatus of claim 2, wherein the controller comprises an integrated circuit.

5. The processing apparatus of claim 4, wherein the integrated circuit comprises an oscillator for cycling power to the valve on and off.

6. The processing apparatus of claim 2, comprising a pressure regulator coupled to the valve for maintaining the pressure of the actuating fluid below a preselected maximum.

7. The processing apparatus of claim 1, wherein the fluid actuated valve comprises a spring biased bellows valve.

8. The processing apparatus of claim 1, comprising a mass flow controller coupled to the fluid actuated valve for restricting the flow of gas from the source of gas.

9. The processing apparatus of claim 1, wherein the actuating fluid comprises a gas.

10. The processing apparatus of claim 1, wherein the processing chamber comprises a chemical vapor deposition chamber.

11. A processing apparatus, comprising:
    a vacuum processing chamber;
    a first source of gas coupled to the vacuum processing chamber;
    a fluid actuated valve for regulating the flow of the gas from the first source of gas to the vacuum processing chamber, the fluid actuated valve being operable to open in response to a flow of an actuating fluid and having a minimum valve opening pressure;
    a valve for enabling the actuating fluid to flow to the fluid actuated valve; and
    a controller for selectively modulating the flow of the actuating fluid to the fluid actuated valve whereby the pressure of the actuating fluid is increased incrementally from an initial pressure to at least the minimum valve opening pressure.

12. The processing apparatus of claim 11, wherein the controller comprises a computer.

13. The processing apparatus of claim 11, wherein the controller comprises an integrated circuit.

14. The processing apparatus of claim 13, wherein the integrated circuit comprises an oscillator for cycling power to the valve on and off.

15. The processing apparatus of claim 11, comprising a pressure regulator coupled to the valve for maintaining the pressure of the actuating fluid below a preselected maximum.

16. The processing apparatus of claim 11, wherein the fluid actuated valve comprises a spring biased bellows valve.

17. The processing apparatus of claim 11, comprising a mass flow controller coupled to the fluid actuated valve for restricting the flow of gas from the source of gas.

18. The processing apparatus of claim 11, wherein the actuating fluid comprises a gas.

19. The processing apparatus of claim 11, wherein the processing chamber comprises a chemical vapor deposition chamber.

20. A processing apparatus, comprising:

a vacuum processing chamber;

a first source of gas coupled to the vacuum processing chamber;

a pressure sensor to sense the pressure in the vacuum processing chamber and being operable to generate an output signal indicative of the pressure sensed;

a fluid actuated valve for regulating the flow of the gas from the first source of gas to the vacuum processing chamber, the fluid actuated valve being operable to open in response to a flow of an actuating fluid and having a minimum valve opening pressure;

a valve for enabling the actuating fluid to flow to the fluid actuated valve; and a controller for selectively modulating the flow of the actuating fluid to the fluid actuated valve in response to the output signal from the pressure sensor whereby the pressure of the actuating fluid is increased incrementally from an initial pressure to at least the minimum valve opening pressure.

21. The processing apparatus of claim 20, wherein the controller comprises a computer.

22. The processing apparatus of claim 20, wherein the controller comprises an integrated circuit.

23. The processing apparatus of claim 22, wherein the integrated circuit comprises an oscillator for cycling power to the valve on and off.

24. The processing apparatus of claim 20, wherein the actuating fluid comprises a gas.

25. The processing apparatus of claim 20, wherein the processing chamber comprises a chemical vapor deposition chamber.

* * * * *